United States Patent
Mikhailov et al.

(10) Patent No.: US 12,132,292 B2
(45) Date of Patent: Oct. 29, 2024

(54) LASER DEVICE

(71) Applicant: FOCUSLIGHT TECHNOLOGIES INC., Xi'an (CN)

(72) Inventors: Aleksei Mikhailov, Dortmund (DE); Chung-En Zah, Holmdel, NJ (US)

(73) Assignee: FOCUSLIGHT TECHNOLOGIES INC., Xi'an (CN)

( * ) Notice: Subject to any disclaimer, the term of this patent is extended or adjusted under 35 U.S.C. 154(b) by 129 days.

(21) Appl. No.: 17/908,468

(22) PCT Filed: Jul. 13, 2021

(86) PCT No.: PCT/CN2021/106107
§ 371 (c)(1),
(2) Date: Aug. 31, 2022

(87) PCT Pub. No.: WO2022/012555
PCT Pub. Date: Jan. 20, 2022

(65) Prior Publication Data
US 2023/0112027 A1    Apr. 13, 2023

(30) Foreign Application Priority Data

Jul. 13, 2020    (DE) .......................... 102020118421.2

(51) Int. Cl.
*H04B 10/00* (2013.01)
*H01S 5/02251* (2021.01)
*H01S 5/02255* (2021.01)
*H01S 5/40* (2006.01)

(52) U.S. Cl.
CPC ...... *H01S 5/02251* (2021.01); *H01S 5/02255* (2021.01); *H01S 5/4012* (2013.01)

(58) Field of Classification Search
CPC ............. H01S 5/02251; H01S 5/02255; H01S 5/4012; H01S 5/02325; H01S 5/4031; G02B 6/4204; G02B 27/106; G02B 27/283; G02B 27/10
See application file for complete search history.

(56) References Cited

U.S. PATENT DOCUMENTS

| | | | | |
|---|---|---|---|---|
| 4,978,197 A * | 12/1990 | Horikawa | .......... | G02B 19/0028 359/823 |
| 5,715,270 A * | 2/1998 | Zediker | ................. | H01S 5/4025 385/47 |
| 6,356,577 B1 * | 3/2002 | Miller | .................. | G02B 27/143 372/100 |
| 7,006,549 B2 * | 2/2006 | Anikitchev | ........ | G02B 19/0057 372/107 |
| 7,668,214 B2 * | 2/2010 | Wilson | ............... | G02B 27/1006 372/50.23 |

(Continued)

*Primary Examiner* — Agustin Bello
(74) *Attorney, Agent, or Firm* — IPro, PLLC

(57) ABSTRACT

This disclosure relates to a laser device. The laser device has laser diodes arranged at least partially side by side in a first direction. In operation of the laser device, light emanates from the laser diodes and couples into an optical fiber. The laser device also has an optical device, during operation of the laser device, that combines the light so that the light can be coupled at least partially together into the optical fiber. The beam parameter product of the laser diodes with respect to the direction in which the laser diodes are arranged next to one another is greater than the beam parameter product of the optical fiber.

11 Claims, 4 Drawing Sheets

(56) References Cited

U.S. PATENT DOCUMENTS

| | | | |
|---|---|---|---|
| 7,773,655 B2* | 8/2010 | Chuyanov | H01S 5/405 372/50.23 |
| 7,817,693 B2* | 10/2010 | Alahautala | G02B 19/0057 372/50.12 |
| 8,306,077 B2* | 11/2012 | Pushkarsky | G02B 6/4206 372/32 |
| 8,427,749 B2* | 4/2013 | Du | H01S 5/02326 359/627 |
| 8,432,945 B2* | 4/2013 | Faybishenko | G02B 6/4296 372/36 |
| 8,437,086 B2* | 5/2013 | Du | H01S 5/405 359/629 |
| 8,711,894 B2* | 4/2014 | Chuyanov | G02B 27/1006 372/50.12 |
| 8,861,082 B2* | 10/2014 | Cobb | G02B 19/0052 359/489.08 |
| 9,014,220 B2* | 4/2015 | Minelly | H01S 3/042 372/71 |
| 9,209,605 B1* | 12/2015 | Guo | H01S 5/4062 |
| 9,214,786 B2* | 12/2015 | Hemenway | H01S 5/146 |
| 9,377,611 B2* | 6/2016 | Govorkov | H01S 5/4012 |
| 9,450,377 B1* | 9/2016 | Roff | H01S 5/005 |
| 9,455,552 B1* | 9/2016 | Price | H01S 5/4075 |
| 9,627,852 B2* | 4/2017 | Hemenway | H01S 5/187 |
| 9,705,289 B2* | 7/2017 | Kanskar | G02B 27/30 |
| 9,819,154 B2* | 11/2017 | Hu | H01S 5/4012 |
| 10,170,892 B2* | 1/2019 | Yanase | G02B 27/0905 |
| 10,261,261 B2* | 4/2019 | Hemenway | G02B 19/0057 |
| 10,283,939 B2* | 5/2019 | Dawson | H01S 5/02255 |
| 10,651,355 B1* | 5/2020 | Hemenway | G02B 27/106 |
| 10,763,640 B2* | 9/2020 | Kanskar | H01S 5/4012 |
| 10,775,571 B2* | 9/2020 | Kasai | H01S 5/4012 |
| 10,797,471 B2* | 10/2020 | Dawson | H01S 5/0239 |
| 10,833,482 B2* | 11/2020 | Chen | G02B 19/0057 |
| 10,855,056 B2* | 12/2020 | Chen | H01S 5/405 |
| 10,971,896 B2* | 4/2021 | Zediker | H01S 5/4012 |
| 11,067,885 B2* | 7/2021 | D'Oosterlinck | G02B 27/48 |
| 11,482,832 B2* | 10/2022 | Elgcrona | H01S 5/4012 |
| 11,824,323 B1* | 11/2023 | Kanskar | H01S 5/4031 |
| 11,881,678 B1* | 1/2024 | Bishop | G02B 3/06 |
| 2004/0233964 A1* | 11/2004 | Yamanaka | G02B 27/0961 372/108 |
| 2004/0252744 A1* | 12/2004 | Anikitchev | G02B 19/0028 372/100 |
| 2008/0019010 A1* | 1/2008 | Govorkov | H01S 5/4012 359/641 |
| 2009/0190218 A1* | 7/2009 | Govorkov | G02B 19/0014 359/489.08 |
| 2009/0245315 A1* | 10/2009 | Faybishenko | G02B 6/4214 372/50.12 |
| 2009/0323752 A1* | 12/2009 | Chuyanov | G02B 19/0052 372/50.23 |
| 2010/0103544 A1* | 4/2010 | Vethake | G02B 27/0905 359/850 |
| 2010/0226405 A1* | 9/2010 | Chuyanov | G02B 19/0014 372/50.12 |
| 2012/0002293 A1* | 1/2012 | Du | H01S 5/02326 359/629 |
| 2012/0002395 A1* | 1/2012 | Du | H01S 5/4012 362/241 |
| 2012/0105968 A1* | 5/2012 | Chann | G02B 27/0905 359/634 |
| 2012/0133903 A1* | 5/2012 | Tanaka | G03B 21/2066 353/31 |
| 2013/0028276 A1* | 1/2013 | Minelly | H01S 3/06704 372/6 |
| 2013/0148684 A1* | 6/2013 | Guo | H01S 5/02326 372/50.12 |
| 2013/0162956 A1* | 6/2013 | Okuda | G03B 21/2013 353/30 |
| 2013/0215923 A1* | 8/2013 | Cobb | G02B 6/29367 372/50.12 |
| 2013/0258469 A1* | 10/2013 | Park | G02B 5/04 359/834 |
| 2014/0211466 A1* | 7/2014 | Dewa | G02B 6/425 362/235 |
| 2015/0131692 A1* | 5/2015 | Hayamizu | G02B 6/4206 372/107 |
| 2015/0280404 A1* | 10/2015 | Kasai | G02B 27/12 359/639 |
| 2015/0295386 A1* | 10/2015 | Hemenway | H01S 5/4012 372/46.01 |
| 2015/0333483 A1* | 11/2015 | Govorkov | H01S 5/0233 372/6 |
| 2016/0119063 A1* | 4/2016 | Guo | H04J 14/02 398/79 |
| 2016/0322777 A1* | 11/2016 | Zediker | G02B 27/0922 |
| 2017/0271837 A1* | 9/2017 | Hemenway | H01S 3/1001 |
| 2018/0183214 A1* | 6/2018 | Dawson | H01S 5/4012 |
| 2018/0191135 A1* | 7/2018 | Yanase | H01S 5/02326 |
| 2018/0198258 A1* | 7/2018 | Chen | H01S 5/4012 |
| 2018/0278013 A1* | 9/2018 | Kanskar | H01S 3/0401 |
| 2018/0309264 A1* | 10/2018 | Kanskar | H01S 5/02423 |
| 2019/0252863 A1* | 8/2019 | Chen | G02B 19/0057 |
| 2020/0064567 A1* | 2/2020 | Kasai | G02B 6/4239 |
| 2021/0072468 A1* | 3/2021 | Uchiyama | H01S 5/02251 |
| 2021/0285619 A1* | 9/2021 | Nishimoto | G02B 27/0972 |
| 2022/0294174 A1* | 9/2022 | Ishige | G02B 27/30 |
| 2023/0059013 A1* | 2/2023 | Hata | G02B 6/42 |
| 2023/0112027 A1* | 4/2023 | Mikhailov | G02B 27/106 385/88 |

* cited by examiner

LASER DEVICE

TECHNICAL FIELD

The present disclosure relates to a laser device.

BACKGROUND

A laser device of the aforementioned type is known from US 2018/0278008 A1. The laser device described therein comprises multiple laser diodes arranged side by side in a row. The light beams emitted by the laser diodes strike mirrors which deflect the light by 90°. In each case, an inclined plane-parallel plate is provided between some of the laser diodes and the mirror associated with this laser diode, which deflects the light emitted from the laser diode upwards or downwards. The mirrors are arranged one behind another in steps in the direction of expansion of the reflected light, so that the light emanating from a mirror arranged at the rear can pass above the mirrors arranged further forward. Overall, through the arrangement of the mirrors and the plane-parallel plates, the laser beams emitted from the laser diodes are arranged one above another and are combined in this way. The laser device further comprises an optical fiber, into which the combined light from the laser diodes is coupled.

SUMMARY

Definition: By laser beam, light beam, partial beam or beam is meant, unless explicitly stated otherwise, not an idealized beam of geometrical optics, but a real light beam, such as a laser beam, which does not have an infinitesimally small but an extended beam cross-section.

The problem underlying the presented disclosure is the creation of a laser device of the type mentioned above, which can generate a laser beam with a higher output power in a comparable installation space.

According to an embodiment, the beam parameter product of the laser diodes in the direction, in which the laser diodes are arranged side by side, is larger than the beam parameter product of the optical fiber. For example, the beam parameter product of the laser diodes in the direction, in which the laser diodes are arranged side by side, could be at least twice as large as the beam parameter product of the optical fiber. In state-of-the-art laser devices, the beam parameter product of the laser diodes in the slow-axis direction is usually chosen to be equal to the beam parameter product of the optical fiber. Laser diodes with larger beam parameter product have larger power. Therefore, by choosing laser diodes with larger beam parameter product, an increase in the output power of the laser device can be achieved for the same size of the laser device. Alternatively, the same output power as known laser devices can be achieved with fewer laser diodes and reduced size of the laser device.

According to an embodiment, the laser device comprises two groups of laser diodes, each comprising multiple laser diodes, wherein the laser diodes of a first of the two groups are arranged side by side in the first direction and wherein the laser diodes of the second of the two groups are arranged side by side in a second direction different from the first direction, in particular perpendicular to the first direction. By providing two groups of laser diodes arranged in rows, the output power of the laser beams can be increased with a comparable installation space. Preferably, the direction in which the laser diodes are arranged next to each other corresponds to the slow-axis direction of the laser diodes. Further preferably, the laser device comprises slow-axis collimating lenses and/or fast-axis collimating lenses for the beams emitted by the laser diodes. In contrast to, for example, rows facing each other, the effective focal length of the slow-axis collimating lenses can be increased by aligning the rows perpendicular to each other. By increasing the focal length, it can be achieved that the light beams emitted by the laser diodes in the slow-axis direction practically do not diverge during the combining of the light emitted by the individual laser diodes. In this way, the losses during the combining are reduced.

According to an embodiment, the laser device comprises a transformation device which, during operation of the laser device, splits the combined light of multiple laser diodes, in particular all laser diodes, in the first and/or the second direction into at least two parts and arranges these two parts next to each other in a third direction which, in particular, is aligned perpendicular to the first and/or the second direction. By such a design, on the one hand, the beam parameter product of the laser beams of the laser diodes in the slow-axis direction can be reduced, in particular halved when divided into two parts. As a result, the laser beam can be coupled into the optical fiber as completely as possible despite the originally larger beam parameter product. Furthermore, fast-axis collimating lenses with a large effective focal length can be used by such a design, so that the light beams emitted by the laser diodes practically do not diverge even in the fast-axis direction. In this way, the losses are further reduced.

It is possible that the transformation device comprises multiple plane-parallel plates and/or at least one telescope, in particular at least one Galilean telescope. By using at least one telescope, suitable size ratios or angular ratios between the slow-axis direction and the fast-axis direction of the combined laser radiation can be achieved to enable optimal focusing on the entrance surface of the optical fiber.

It may be provided that the row of laser diodes formed by the laser diodes of the first group and the row of laser diodes formed by the laser diodes of the second group cross each other. The possibility of also allowing the rows of laser diodes to cross in certain designs of the laser device increases the design freedom in the design of the laser device. It is possible to choose the distance from the rows of laser diodes to the optical device in such a way that the optical design of the laser device can be optimized. This leads to the fact that the output power achievable with the laser device can be close to the theoretical maximum. This further leads to the fact that a low-cost optical fiber can also be used, which usually requires an optimal coupling. By using a low-cost optical fiber, the manufacturing cost of the laser device can be significantly reduced.

It is possible for the optical device to comprise multiple mirrors, where each of the laser diodes is assigned with a mirror so that the light emitted by the respective laser diode is reflected in such a way by the assigned mirror during operation of the laser device, that the emitting direction of the beam changes, in particular by approximately 90°. In this case, the laser device can be designed in such a way that the areas of incidence of the light from individual laser diodes, in particular from all laser diodes, arranged next to one another in the first and/or the second direction, are offset with each other in the third direction, so that the light emitted from different laser diodes arranged next to one another in the first and/or the second direction is arranged next to one another in the third direction after reflection at the mirrors assigned to these laser diodes. The laser beams emitted from the individual laser diodes of a row are thus arranged one above the other by the optical device in the third direction, which may correspond to the vertical in the state of use. The offset of the light on the mirrors in the third direction can be achieved, for example, by suitable optical elements such as inclined plane-parallel plates between the laser diodes and the mirrors. Alternatively, such an offset can also be achieved by appropriate positioning of the fast-axis collimating lens associated with the respective laser diode. Alternatively, the laser diodes of one of the groups 1 in the third may have exit regions for the light that are offset from each other. This can be achieved, for example, by arranging the laser diodes in different positions in the third direction.

It is possible that the optical device comprises a beam combiner which combines the light emitted by the two groups of laser diodes during operation of the laser device. The beam combiner can, for example, be designed as a polarization cube or as a mirror. It is possible that the laser device comprises multiple first groups of laser diodes arranged side by side in the third direction, and/or that the laser device comprises multiple second groups of laser diodes arranged side by side in the third direction. Further, the laser device may comprise multiple optical devices arranged side by side in the third direction. In this way, the laser beams from two respective rows of laser diodes can be combined in multiple planes one above the other, and the laser beams from the different planes can also be combined with one another so that the laser beams emitting from all of the laser diodes can be coupled together into the optical fiber.

It is possible that the laser device comprises a housing in which the laser diodes and the optical device are arranged and the optical fiber is held. In particular, the housing may comprise a base plate on which the laser diodes and the optics are mounted. The third direction is oriented perpendicular to the base plate, so that the third direction will generally correspond to the vertical during operation of the laser device.

BRIEF DESCRIPTION OF FIGURES

In the figures, identical and functionally identical parts are marked with identical reference signs. Cartesian coordinate systems are drawn in some of the figures for better orientation.

DETAILED DESCRIPTION

Figure 1:
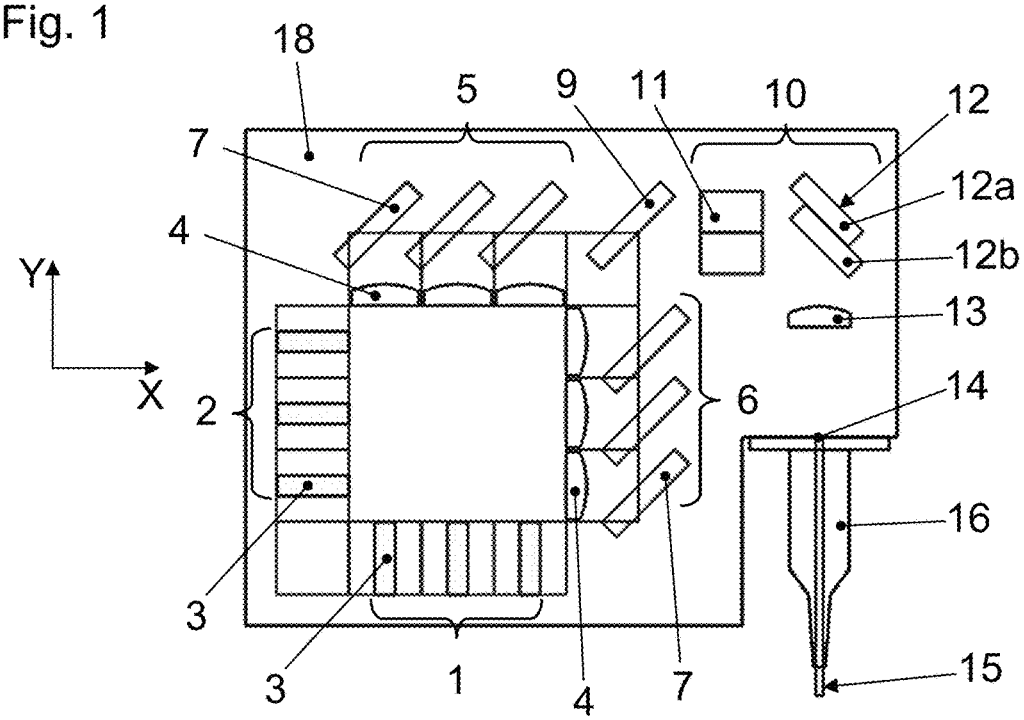
FIG. 1 shows a schematic top view of a first embodiment of a laser device.

The embodiment of a laser device shown in FIG. 1 comprises two groups 1, 2 based on laser diodes 3, which are only schematically indicated and from which light is emitted during operation of the laser device. The laser diodes 3 of the first group 1 are arranged side by side in a first direction X, whereas the laser diodes 3 of the second group 2 are arranged side by side in a second direction Y, which is aligned perpendicular to the first direction X.

In the embodiment example illustrated in FIG. 1, the first group 1 comprises three laser diodes 3 arranged equidistantly to each other. Furthermore, the second group 2 also comprises three laser diodes 3 arranged equidistantly to each other, wherein the distance between the laser diodes 3 of the first group 1 is equal to the distance between the laser diodes 3 of the second group 2.

It is certainly possible to provide more or less than three laser diodes 3 per group 1, 2. Furthermore, it is also possible to provide a different number of laser diodes 3 in the first group 1 than in the second group 2.

In this case, the slow-axis direction of the laser diodes 3 of the first group 1 is parallel to the first direction X, or to the direction X in which the laser diodes 3 of the first group 1 are arranged next to each other. Furthermore, the slow-axis direction of the laser diodes 3 of the second group 2 is parallel to the second direction Y, or to the direction Y in which the laser diodes 3 of the second group 2 are arranged next to each other. The fast-axis direction of the laser diodes 3 is parallel to a third direction Z, which is aligned perpendicular to the first and the second directions X, Y, respectively.

The laser device comprises not shown fast-axis collimation lenses for the at least partial collimation of the light emitted by the laser diodes 3 with respect to the third direction Z. The laser device further comprises slow-axis collimation lenses 4 for the at least partial collimation of the light emitted by the laser diodes 3 with respect to the first direction X and with respect to the second direction Y. The laser device is designed in such a way that the light emitted by the laser diodes 3 first passes through the fast-axis collimation lenses and then through the slow-axis collimation lenses 4.

The laser device further comprises a first group 5 and a second group 6 of mirrors 7, the first group 5 of mirrors 7 being associated with the first group 1 of laser diodes 3 and the second group 6 of mirrors 7 being associated with the second group 2 of laser diodes 3. In particular, each of the mirrors 7 is arranged such that the light emitted by one of the laser diodes 3 is reflected by exactly one of the mirrors 7.

In this case, the fast-axis collimating lenses and then the slow-axis collimating lenses 4 are arranged between the laser diodes 3 and the mirrors 7.

The mirrors 7 of the first group 5 are offset to each other in Z-direction (not shown). Furthermore, the incident areas of the laser beams of the first group 1 emitted from the individual laser diodes 3 on the mirrors 7 of the first group 5 are offset from each other in the Z-direction.

In this way, it can be achieved that, for example, the left mirror 7 of the first group 5 in FIG. 1 is arranged further down in the Z-direction than the middle mirror 7 and that, furthermore, the middle mirror 7 in FIG. 1 is arranged further down in the Z direction than the right mirror 7. If at the same time the incident areas of the laser beams of the first group 1 emitted from the individual laser diodes 3 on the mirrors 7 of the first group 5 are arranged correspondingly offset to each other in the Z-direction, the light reflected from the mirror 7 on the left in FIG. 1 can pass in the Z-direction under the middle mirror to the right in FIG. 1. Similarly, the light emitted by the left mirror 7 in FIG. 1 and the light emitted by the center mirror 7 in FIG. 1 can pass in the Z-direction under the right mirror 7 to the right in FIG. 1. The laser beams reflected by the mirrors 7 are then arranged one above the other in the Z-direction behind the right mirror 7 in FIG. 1.

Similarly, the mirrors 7 of the second group 6 are offset from one another in the Z-direction (not shown). Furthermore, the incident areas of the laser beams of the second group 2 emitted from the individual laser diodes 3 on the mirrors 7 of the second group 6 are offset from each other in the Z-direction.

In this way, it can be achieved that, for example, the lower mirror 7 of the second group 6 in FIG. 1 is arranged further down in the Z-direction than the middle mirror 7 and that, furthermore, the middle mirror 7 in FIG. 1 is arranged further down in the Z-direction than the upper mirror 7 in FIG. 1. If at the same time the incident areas of the laser beams of the second group 1 emitted from the individual laser diodes 3 on the mirrors 7 of the second group 6 are arranged correspondingly offset to one another in the Z-direction, the light reflected from the lower mirror 7 in FIG. 1 can pass through in the Z direction under the middle mirror to the top in FIG. 1. Similarly, the light emitted by the lower mirror 7 in FIG. 1 and the light emitted by the middle mirror 7 in FIG. 1 can pass in the Z-direction under the upper mirror 7 to the top of FIG. 1.

The offset of the incident areas of the light emitted by the individual laser diodes 3 of one of the groups 1, 2 on the mirrors 7 can be achieved, for example, by arranging plane-parallel plates or other optical elements between the laser diodes 3 and the mirrors 7 assigned to them, which offset the light emitted by the individual laser diodes 3 in the Z-direction upwards or downwards. Such a design is described, for example, in US 2018/0278008 A1.

Alternatively, such an offset in positive or negative Z-direction can also be achieved by a corresponding positioning of the fast-axis collimation lens associated with the respective laser diode 3.

Alternatively, the laser diodes 3, one of the group 1, can also have exit areas for the light that are offset from one another in the Z-direction. This can be achieved, for example, by arranging the laser diodes in different positions in the Z-direction.

The structure of the laser device shown in FIG. 1 further comprises a beam combiner which is designed as a mirror 9. The mirror 9 is designed and arranged in such a way that it reflects the lights from each mirror (start from mirror 7) of the second group 6 to the right in the X-direction in FIG. 1. The mirror 9 is further designed and arranged in such a way that the light from each mirror (start from mirror 7) of the first group 5 can pass the mirror unhindered to the right in the X-direction in FIG. 1. Thereby, the light coming from each mirror (start from mirror 7) of the first group 5 will pass the mirror 9 in Z-direction above or below. To make this possible, the mirrors of the first group 5 and the incident areas of the laser beams coming from the first group 1 are arranged in the Z-direction above or below the mirrors 7 of the second group 6 and the incident areas of the laser beams emanating from the second group 2.

Figure 8:
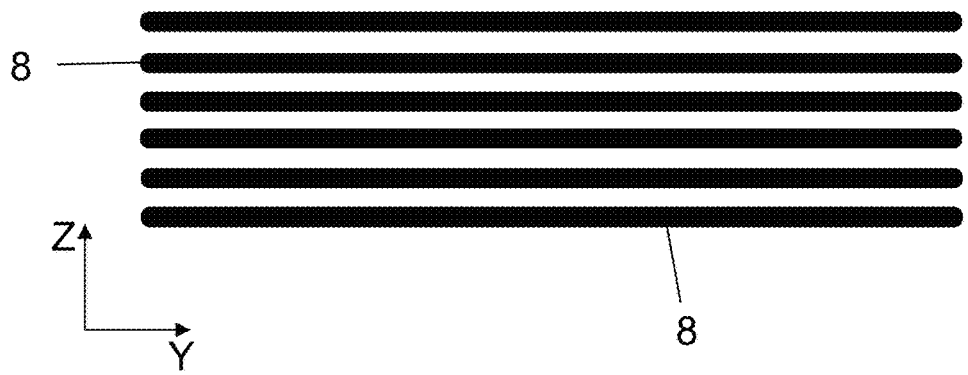
FIG. 8 shows a cross-section of the light spreading in the laser device in front of a transformation device of the first embodiment of a laser device.

In this way, it is achieved that the total of six laser beams reflected by the mirror 9 and laser beams passing by the mirror 9 are arranged one above the other in the Z-direction on the right of the mirror 9 in FIG. 1. FIG. 8 shows a cross-section through the laser beams behind the mirror 9, with the six intensity distributions of the laser beams arranged one above the other in the Z-direction.

The structure of the laser device shown in FIG. 1 further contains a transformation structure 10 which splits the combined light of the six laser diodes 3 in the second direction Y into two parts and arranges these two parts on top of each other in the third direction Z.

The transformation structure 10 contains its first component 11 which splits the combined light of the six laser diodes 3 in the Y-direction into two parts and arranges these parts on top of each other in the Z-direction.

Figure 9:
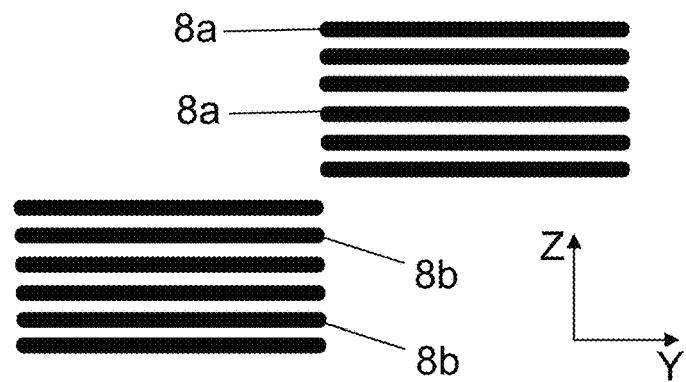
FIG. 9 shows a cross-section of the light spreading in the laser device after passing through a first component of the transformation device of the first embodiment of a laser device.

For this purpose, the transformation device 10 comprises a first component 11 which splits the combined light of the six laser diodes 3 into two parts in the Y-direction and offsets these parts with respect to each other in the Z-direction. This can be seen in FIG. 9. The six intensity distributions 8 shown there are each divided into two parts 8a, 8b in Y-direction and offset to each other in Z-direction.

Figure 4:
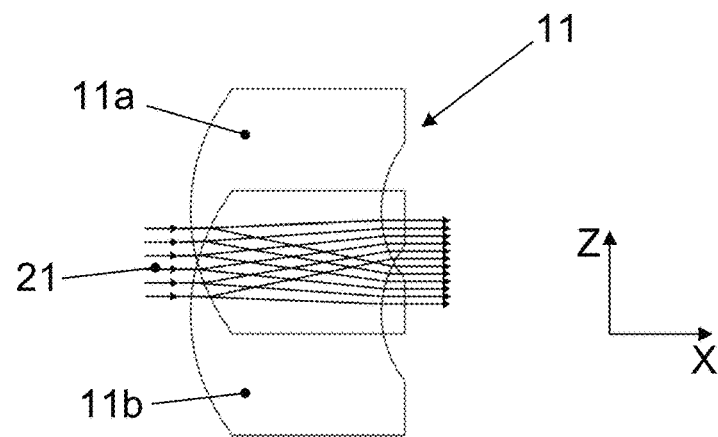
FIG. 4 shows a detailed view of a telescope of the laser device according to FIG. 2.

The first component 11, for example, consists of two telescopes 11a and 11b, which are shown in FIG. 4. The telescopes 11a and 11b are Galileo-telescopes, actually the telescope 11a or 11b is a part of any kind of an anamorphic optics. The telescopes 11a, 11b can be reducing telescopes which, for example, can reduce the cross section of the light impinging on them by a reduction factor of 1.8.

The six laser beams that are arranged one below the other in the Z-direction, fall on the telescopes 11a, 11b and are converted by the telescopes 11a, 11b into twelve laser beams. The twelve laser beams are arranged one below the other in the Z-direction, six of which, however, are also offset from one another in the Y-direction (see also according to FIG. 9).

Besides the telescopes 11a, 11b, the first component 11 can also comprise other optical components which split the combined light from the laser diodes 3 into two parts in the Y-direction and offset these parts in the Z-direction. For example, correspondingly arranged plane-parallel plates can also be considered for this. For example, two differently arranged plane-parallel plates can be arranged next to one another in the Y-direction.

Alternatively, both telescopes and plane-parallel plates can be provided, the telescopes being responsible for a reduction in size and the plane-parallel plates being responsible for the desired offset.

Figure 10:
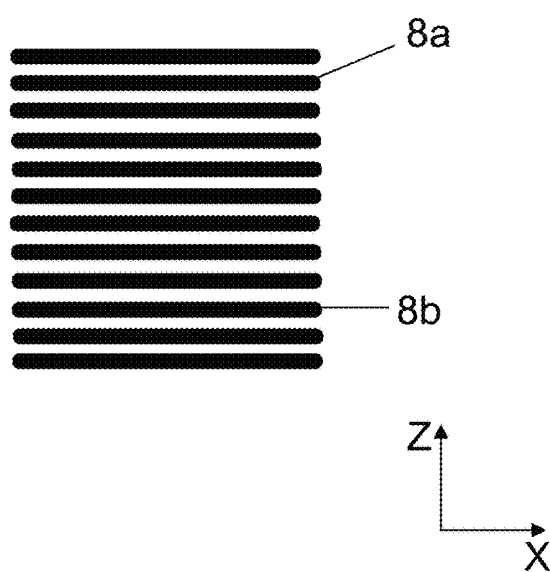
FIG. 10 shows a cross-section of the light spreading in the laser device after passing through the transformation device of the first embodiment of a laser device.

The transformation structure 10 also has its second component 12, which offsets the two parts of the light offset from one another in the Z-direction and arranged next to one another in the Y-direction relative to one another in the Y direction so that they are arranged one above the other in the Z-direction. This is shown in FIG. 10, where the twelve parts 8a, 8b of the intensity distributions are no longer offset in the Y-direction and are arranged one above the other in the Z direction.

The second component 12 can have two mirrors 12a, 12b, for example. One of the two mirrors 12a, 12b can be assigned to one of the two parts 8a, 8b of the intensity distributions. For example, the mirror 12a can be offset upwards in the Z-direction relative to the mirror 12b, so that the first part 8a of the light in the Z-direction can impinge on the mirror 12a over the mirror 12.

The laser structure furthermore comprises focusing optics 13, which can focus the light coming from the transformation structure 10 onto the entry surface 14 of an optical fiber 15 likewise comprised by the laser device. The optical fiber 15 is held in position by a holder 16.

It should be noted here that the beam parameter product of each of the laser diodes 3 in the slow-axis direction is about twice as large as the beam parameter product of the optical fiber 15. Despite this ratio, the light 21 emitted by the laser diodes 3 can be almost completely coupled into the optical fiber 15 because the transformation device 10 halves the beam parameter product of the laser beams in the slow-axis direction.

Figure 11:
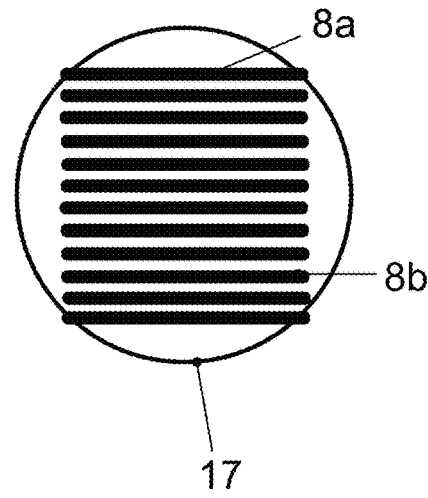
FIG. 11 shows a cross-section of the light spreading in the laser device on the entrance surface of the optical fiber of the first embodiment of a laser device.

FIG. 11 shows the cross-section of the intensity distribution of the light incident on the entrance surface 14 of the optical fiber 15, where the edge of the entrance surface 14 has been given the reference number 17.

The laser structure further comprises a housing, of which only a base plate 18 is shown, on which the laser diodes 3 and the optical components can be mounted. The base plate 18 can in particular serve as a cooling plate for the plurality of laser diodes.

Figure 2:
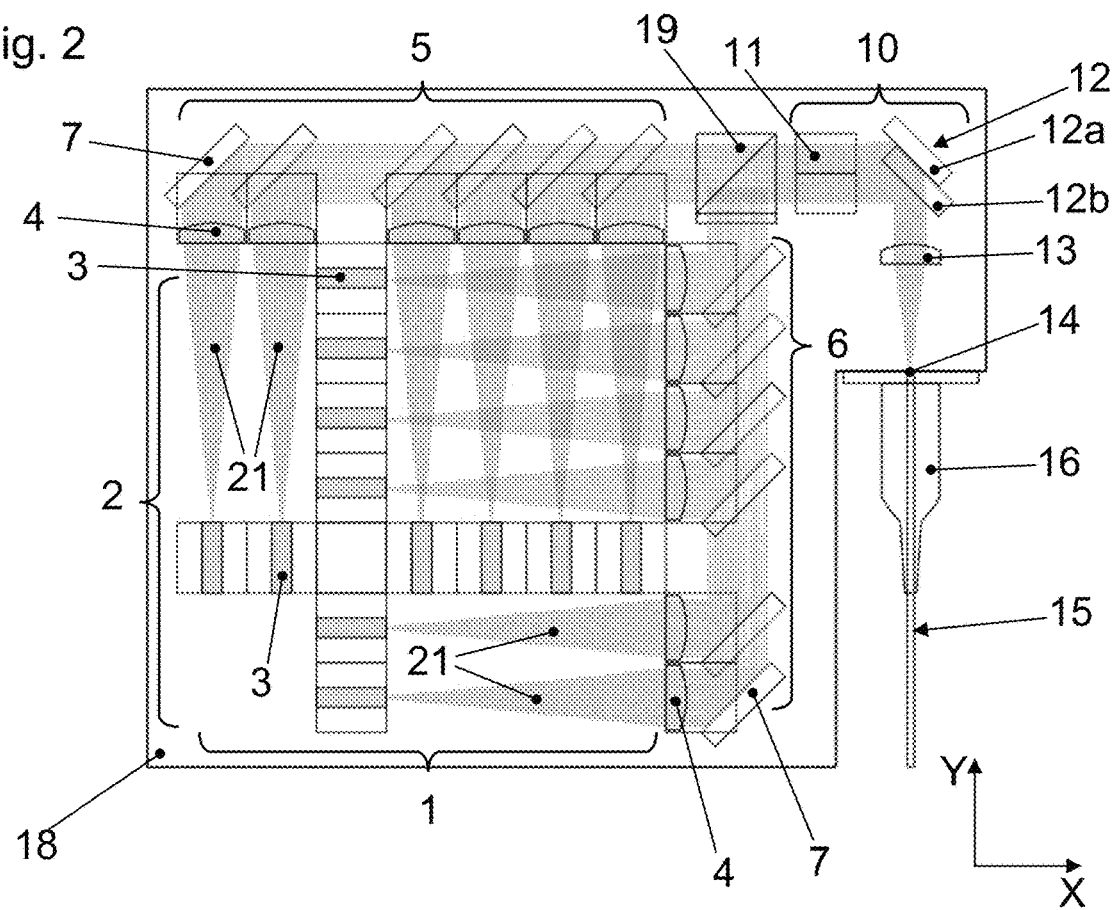
FIG. 2 shows a schematic top view of a second embodiment of a laser device with indicated beam paths of the light.
Figure 3:
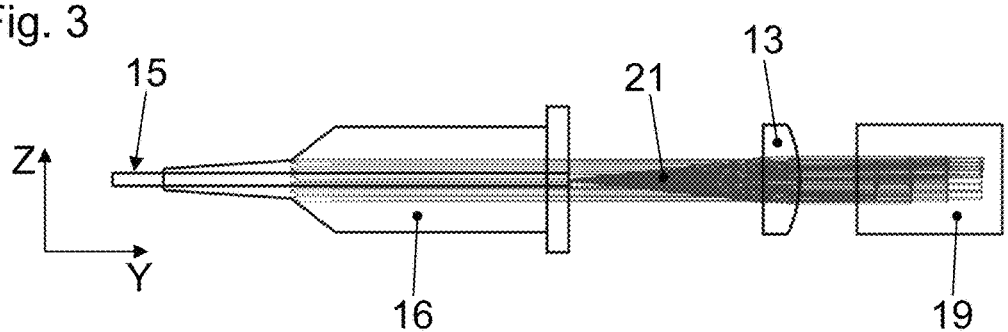
FIG. 3 shows a side view of the laser device according to FIG. 2.

In the second structure according to FIG. 2, the light 21 emitted by the laser diodes 3 is drawn for clarity. The second structure differs from that according to FIG. 1 on the one hand in that each group 1, 2 has six laser diodes 3. On the other hand, the groups 1, 2 of laser diodes 3 are also shifted somewhat with respect to each other in the X-direction and in the Y-direction, so that the rows formed by laser diodes 3 cross each other.

This displacement or offset of the rows of laser diodes 3 relative to each other allows better adaptation to, for example, parameters of the optical system formed by the lenses and mirrors when designing the laser device. For example, by suitable selection of the distance of the row of laser diodes 3 from the mirrors 7, it is possible to influence the required focal length of the slow-axis collimating lenses 4. The focal length of the slow-axis collimation lenses 4 is in turn responsible for the size of the laser device.

Furthermore, the second structure shown in FIG. 2 differs from the structure shown in FIG. 1 in the design of the beam combiner. The beam combiner of this structures not designed as a mirror but as a polarization coupler 19. The polarization coupler 19 allows light with a first polarization direction to pass through unhindered in a manner known per se and reflects light with a polarization direction perpendicular thereto. For this purpose, a polarization rotator such as a half-wavelength plate can be provided in front of the polarization coupler 19 in one of the two paths of the light coming from the two groups 1, 2.

By using a polarization coupler 19, it can be achieved that the laser beams emitted by the laser diodes 3 of the first group 1 are arranged at the same height in Z-direction as the laser beams emitted by the laser diodes 3 of the second group 2. Thus, both one of the laser diodes 3 of the first group 1 and one of the laser diodes 3 of the second group 2 contribute to each of the intensity distributions 8 in FIG. 8.

Figure 5:
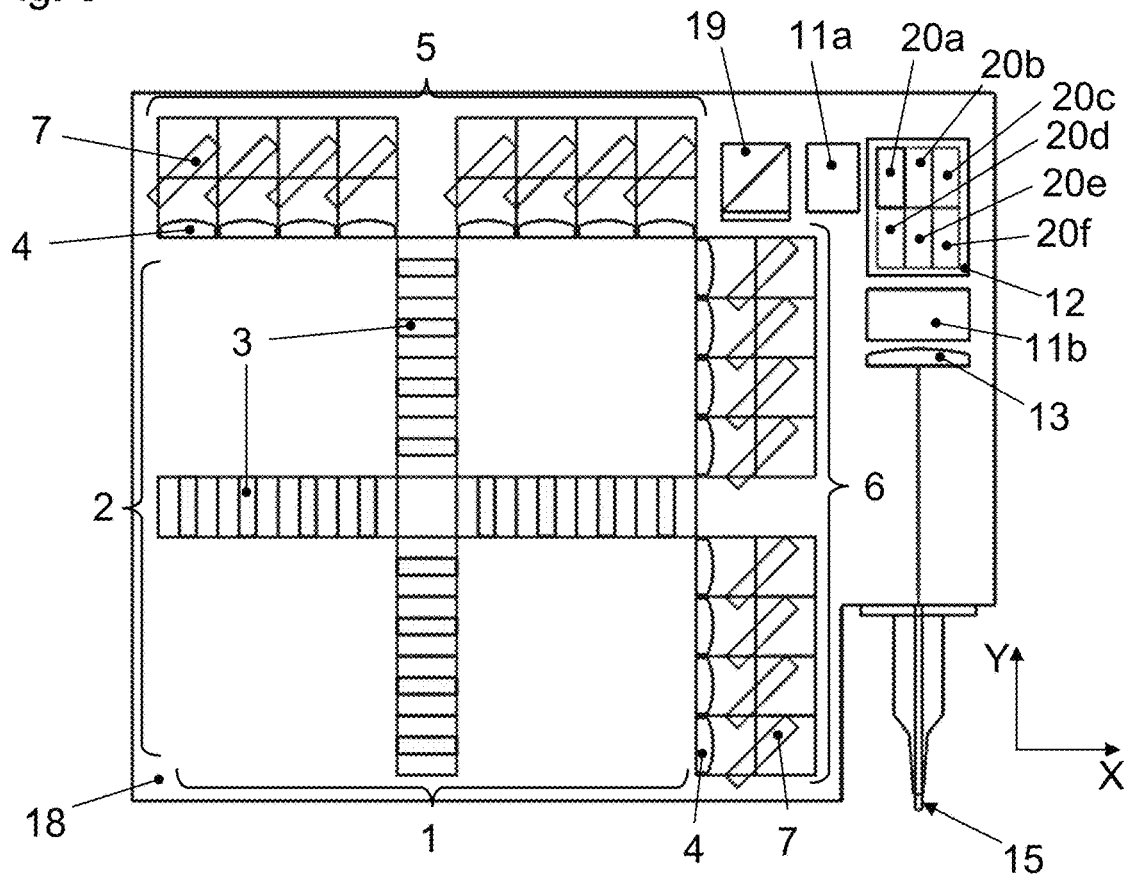
FIG. 5 shows a schematic top view of a third embodiment of a laser device.
Figure 6:
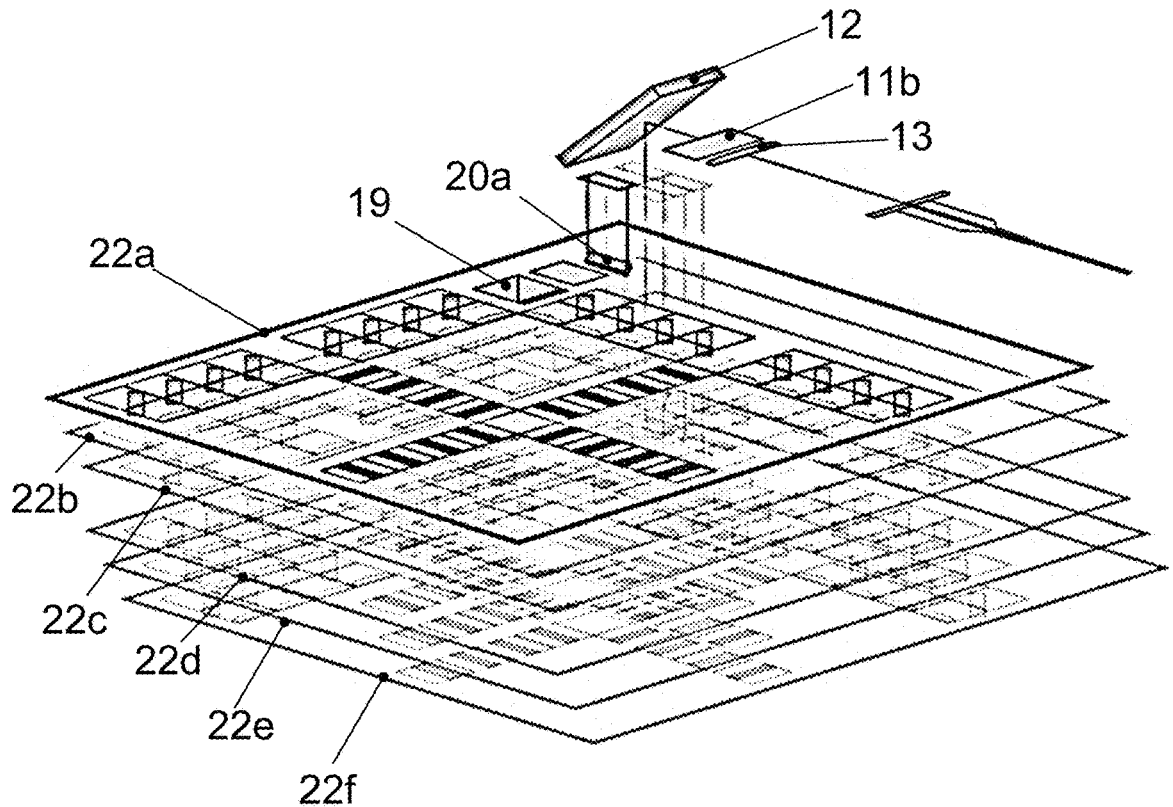
FIG. 6 shows a perspective view of the laser device according to FIG. 5.

In contrast to the first and second structure examples, the third structure example according to FIG. 5 has six planes 22a, 22b, 22c, 22d, 22e, 22f arranged one above the other in the Z-direction (see FIG. 6). Of these six planes, only one is shown in FIG. 5. It is quite possible to provide more or less than six planes.

Each of these planes 22a, 22b, 22c, 22d, 22e, 22f can be configured like the plane 22a shown in FIG. 5. In the case of the plane 22a of the laser device shown in FIG. 5, two groups 1, 2 of eight laser diodes 3 each are provided. In this structure, the groups 1, 2 of laser diodes 3 are shifted in the X-direction and in the Y-direction even slightly more relative to each other than in the second structure according to FIG. 2.

Also in the plane 22a shown in FIG. 5, a polarization coupler 19 is provided as a beam combiner.

Figure 7:
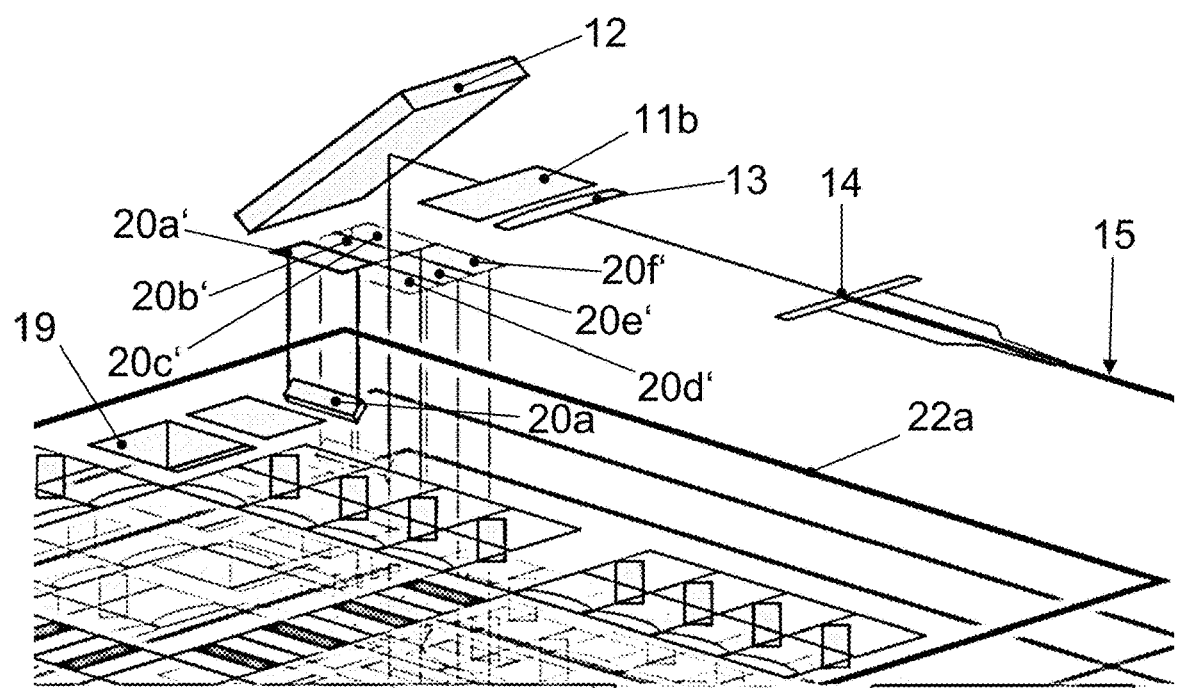
FIG. 7 shows a detail of FIG. 6.

The transformation device of each plane 22a, 22b, 22c, 22d, 22e, 22f comprises, for example, a first telescope 11a. For all planes 22a, 22b, 22c, 22d, 22e, 22f together, a second telescope 11b may be provided to suitably shape the merged laser beams. The transformation device further comprises at least one common mirror 12 (see FIG. 6 and FIG. 7).

The laser structure further comprises six mirrors 20a, 20b, 20c, 20d, 20e, 20f arranged one above the other in the Z-direction, each of which reflects the laser beams of a plane 22a, 22b, 22c, 22d, 22e, 22f in such a way that they no longer propagate in the positive X-direction or to the right in FIG. 5 but upward in the Z-direction. The mirrors 20a, 20b, 20c, 20d, 20e, 20f are also offset from each other in the X-direction and in the Y-direction, as can be seen from the plan view in FIG. 5 or the projection 20a', 20b', 20c', 20d', 20e', 20f' added for clarification in FIG. 6 and FIG. 7.

The laser radiation propagating upwards in the Z-direction is deflected by the common mirror 12 in the negative Y-direction or downwards in FIG. 5. Then pass through the second telescope 11b and are focused on the entry surface 14 of the optical fiber 15 by the focusing optics 13.

What is claimed is:

1. Laser device, comprising
    a laser diode LD1i (i=1, 2, . . . , N) of a first group, arranged apart from one another along a first direction (X),
    a laser diode LD2i (i=1, 2, . . . , N) of a second group, arranged apart from one another along a second direction (Y), the second direction (Y) being different from the first direction (X), N being an integer greater than 1,
    an optical structure configured to combine a laser beam B1i (i=1, 2, . . . , N) emitted from the laser diode LD1i (i=1, 2, . . . , N) and a laser beam B2i (i=1, 2, . . . , N) emitted from the laser diode LD2i (i=1, 2, . . . , N) into a combined laser beam CBi (i=1, 2, . . . , N), the combined laser beam CBi (i=1, 2, . . . , N) being offset from one another in a third direction (Z) perpendicular to both the first direction (X) and the second direction (Y),
    an optical fiber,
    wherein a beam parameter product of the laser beam B1i (i=1, 2, . . . , N) and a beam parameter product of the laser beam B2i (i=1, 2, . . . , N) are each greater than a beam parameter product of the optical fiber;
    wherein a row formed by the laser diodes of the first group overlaps a row formed by the laser diodes of the second group;
    wherein the laser device further comprises a transformation device configured to split the combined laser beam CBi (i=1, 2, . . . , N) into at least a first sub-beam CBia and a second sub-beam CBib (i=1, 2, . . . , N) offset in the first direction (X), the second direction (Y) or both, and configured to then offset the first sub-beam CBia (i=1, 2, . . . , N) and the second sub-beam CBib (i=1, 2, . . . , N) from one another in the third direction (Z).

2. The laser device according to claim 1, wherein the transformation device comprises a plurality of plane-parallel plates, a telescope, or both.

3. The laser device according to claim 1, wherein the beam parameter product of the laser beam B1i (i=1, 2, . . . , N) and the beam parameter product of the laser beam B2i (i=1, 2, . . . , N) are each at least twice as large as the beam parameter product of the optical fiber.

4. The laser device according to claim 1, wherein a slow-axis direction of the laser diodes of the first group is in the first direction (X).

5. The laser device according to claim 1, further comprising slow-axis collimating lenses configured to collimate the laser beam B1i (i=1, 2, . . . , N) in a slow-axis direction of the laser diodes of the first group and fast-axis collimating lenses configured to collimate the laser beam B1i (i=1, 2, . . . , N) in a fast-axis direction of the laser diodes of the first group, or both the slow-axis collimating lenses and the fast-axis collimating lenses.

6. The laser device according to claim 1, wherein the optical structure comprises mirrors configured to change a propagation direction of the laser beam Bli (i=1, 2, . . . , N).

7. The laser device according to claim 6, wherein an incident area of the laser beam B1i (i=1, 2, . . . , N) on the mirrors is offset in the third direction (Z) from one another.

8. The laser device according to claim 1, further comprising laser diodes of a third group, arranged along the first direction (X) and offset from the laser diodes of the first group in the third direction (Z).

9. The laser device according to claim 1, further comprising a housing in which the laser diodes of the first group, the laser diodes of the second group, the optical structure and the optical fiber are supported.

10. The laser device according to claim 1, wherein the first direction (X) is perpendicular to the second direction (Y).

11. The laser device according to claim 1, wherein the transformation device configured is further configured to then align the first sub-beam CBia (i=1, 2, . . . , N) and the second sub-beam CBib (i=1, 2, . . . , N) in the first direction (X), the second direction (Y) or both.

* * * * *